(12) United States Patent
Matsunaga et al.

(10) Patent No.: US 7,495,288 B2
(45) Date of Patent: Feb. 24, 2009

(54) SEMICONDUCTOR APPARATUS INCLUDING A RADIATOR FOR DIFFUSING THE HEAT GENERATED THEREIN

(75) Inventors: Takashi Matsunaga, Kanagawa-ken (JP); Takamasa Usui, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 11/730,948

(22) Filed: Apr. 5, 2007

(65) Prior Publication Data

US 2007/0187830 A1 Aug. 16, 2007

Related U.S. Application Data

(62) Division of application No. 10/873,306, filed on Jun. 23, 2004, now Pat. No. 7,217,979.

(30) Foreign Application Priority Data

Jun. 23, 2003 (JP) .............................. P2003-178237

(51) Int. Cl.
*H01L 23/62* (2006.01)
*H01L 23/48* (2006.01)

(52) U.S. Cl. .................. 257/355; 257/173; 257/758

(58) Field of Classification Search ................. 257/173, 257/174, 355–358, 360–361, 758
See application file for complete search history.

(56) References Cited

U.S. PATENT DOCUMENTS 5,739,587 A 4/1998 Sato
6,642,622 B2 11/2003 Usui
6,762,466 B2 7/2004 Huang et al.

FOREIGN PATENT DOCUMENTS

| JP | 1-246546 | 10/1989 |
| JP | 3-248567 | 11/1991 |
| JP | 5-3286 | 1/1993 |
| JP | 5-326851 | 12/1993 |

(Continued)

OTHER PUBLICATIONS

Notification of Reason(s) for Rejection issued by the Japanese Patent Office on Sep. 11, 2007, for Japanese Patent Application No. 2003-178237, and English-language translation thereof.

*Primary Examiner*—Hung Vu
(74) *Attorney, Agent, or Firm*—Finnegan, Henderson, Farabow, Garrett & Dunner, L.L.P.

(57) ABSTRACT

A semiconductor apparatus is provided that includes a radiator for efficiently radiating heat generated in a wiring layer used in a surge current path of an electrostatic discharge protection circuit, and also for protecting the wiring layer itself used as the surge current path. The semiconductor apparatus includes an input protection circuit coupled to a wiring provided between an external terminal and an internal circuit, the input protection circuit includes a protection element for protecting the internal circuit from an excessive electrostatic surge input supplied to the external terminal. The semiconductor apparatus further includes a first metal wiring layer coupled to the input protection circuit and included in a current path for the surge electrostatic surge input, and a radiator including a sufficient thermal conductivity material coupled to the first metal wiring layer.

6 Claims, 10 Drawing Sheets

FOREIGN PATENT DOCUMENTS

| | | |
|---|---|---|
| JP | 6-97256 | 4/1994 |
| JP | 10-22454 | 1/1998 |
| JP | 10-270640 | 10/1998 |
| JP | 2001-57366 | 2/2001 |
| JP | 2001-156168 | 6/2001 |
| JP | 2002-299463 | 10/2002 |

(PRIOR ART)

(PRIOR ART)

SEMICONDUCTOR APPARATUS INCLUDING A RADIATOR FOR DIFFUSING THE HEAT GENERATED THEREIN

CROSS-REFERENCE TO RELATED APPLICATIONS

This is a division of application Ser. No. 10/873,306, filed Jun. 23, 2004, now U.S. Pat. No. 7,217,979 which is incorporated herein by reference.

This application claims priority from, and the benefit of, Japanese Application No. 2003-178237, filed on Jun. 23, 2003, the contents of which are expressly incorporated herein by reference in their entirety.

BACKGROUND OF THE INVENTION

1. Field of the Invention

The present invention relates to a semiconductor apparatus, including an electrostatic discharge protection circuit (hereinafter referred to as an "ESD protection circuit") for protecting internal circuits from electrostatic discharge (hereinafter simply referred to as "ESD") caused by too much electrostatic input through an external circuit, and more particularly, to a semiconductor apparatus including a radiator for diffusing the heat generated in the ESD protection circuit.

2. Description of the Background Art

To understand an example of an ESD protection circuit for a semiconductor apparatus, an equivalent circuit of an ESD protection circuit is illustrated in FIG. 15. As shown, ESD protection circuit 90 is usually provided between input terminal 91 (hereinafter frequently referred to as "bonding pad 91") on a semiconductor chip, and output terminal 93 for connection to an internal circuit (not shown). Bonding pad 91 and an internal circuit are coupled through input wiring 92, and one terminal of ESD protection circuit 90 is connected to input wiring 92. The other terminal of ESD protection circuit 90 is coupled to the grounding node. In FIG. 15, ESD protection circuit 90 is constructed by an n-channel metal oxide semiconductor (NMOS) transistor, e.g., NMOS field-effect transistor (NMOSFET) element. Thus, gate terminal G of the NMOSFET is directly connected to source terminal S of the NMOSFET in order to use the protection element as a diode. Drain terminal D of the NMOSFET is connected to input wiring 92, and source terminal S is grounded.

FIG. 16 illustrates a cross-sectional view of an example configuration of the EDS protection element of the NMOSFET portion of ESD protection circuit 90, shown in FIG. 15. In p-type semiconductor substrate 1, drain area 3 and source area 4 are formed as an n-type diffused layer between element separating areas 2. Insulating film 5 is provided on a channel area covering the area between drain area 3 and source area 4. Gate electrode 6 is formed on insulating film 5. Interlayer insulating film 7 covers p-type semiconductor substrate 1. Two contact holes are provided in interlayer insulating film 7 at respective positions of each surface of drain area 3 and source area 4. Two plug-shaped contacts 8 and 9, hereinafter, sometimes referred to as contact plugs, are embedded in each of the two contact holes. At a position corresponding to each of two plugs 8 and 9, drain wiring 10 and source wiring 11 are connected, respectively. Drain wiring 10 and source wiring 11 are formed by a first layer metal wiring, for example, copper (Cu) or aluminum (Al). On each surface portion of drain area 3 and source area 4, metal silicide layer 12 is provided, so as to contact to each of plugs 8 and 9, respectively.

Eventually, when too much voltage input is supplied to the internal circuit, a breakdown of the EDS protection element will likely occur at the level of individual elements in the EDS protection element, such as at a gate element or a resistance element in a metal-oxide semiconductor field-effect transistor (MOSFET). Such a breakdown of protection element 90 occurs due to layer fusing caused by the joule heat generated in the layers, when too much current flows into the EDS protection circuit.

Conventionally, it has been proposed to increase a resistance value of the n-type diffused layer 22, in order to increase tolerance against such a situation when too much voltage is input for the protection of MOSFET element 90 itself. For example, it has been proposed to expand the width of n-type diffused layer 22 on gate electrode 6, along a parallel direction. Also, it has been proposed to expand each space between gate electrode 6 and respective contacts 8 and 9 provided on n-type diffused layer 22.

However, recent advances in technology for a semiconductor apparatus have achieved a fine process for reducing a wiring width, and a thinness of a wiring film. By reducing wiring delays, or achieving a low value of permittivity of an interlayer insulating film, it becomes possible to achieve a high-performance semiconductor device. Further, it has recently been proposed to construct wiring layers in a stacked multiple-layer form. In order to achieve these recent advances in technologies, it has been considered to take some measures to protect the wiring layers of the stacked multiple-layer, since such a stacked multiple-layer form inevitably reduces radiation effects of the wiring layers. Thus, one needs to provide a surge current path for the ESD protection circuit.

To protect wiring layers used as the surge current path in the ESD protection circuit, it has been proposed to simply expand a width of the wiring layer, so as to increase tolerance against excessive voltage input. However, this measure is insufficient for protecting the wiring layer in the ESD protection circuit, since excessive current flow due to the excessive voltage input into the ESD protection circuit easily exceeds over many tens to hundreds times of a permitted current density (defined by electromigration (ED)) in the wiring layer acting as a surge current path. Consequently, the generated heat that is caused by such a large surge current may easily fuse the wiring layers for connecting to the internal circuit.

FIG. 17 displays a relationship between an amount of current flowing into a metal wiring layer and an increase in temperature caused by the heat generated in the wiring layers. A ratio of a contact surface (CS) to a diffused layer surface is used as a parameter for the relationship between the current and the temperature increase. Thus, in FIG. 17, the black-circle line shows a 0.1% size ratio of metal wiring layer contact surface to the diffused layer in the substrate. The black-rectangular line depicts a change in the ratio to 1%, and the black-triangle line depicts a change in the ratio to 10%. It is understood that an increase amount of the generated heat (shown on the ordinate in FIG. 17 as the "temperature increase") reduces in accordance with an increase of the size ratio of the contact plug. Thus, the generated heat is absorbed into the semiconductor substrate, such as a silicon substrate, through the contact surface (CS) 22, shown in FIG. 16. Accordingly, the temperature increase of the metal wiring layer cannot be reduced according to conventional techniques.

Japanese Patent Application Publication No. 5-3286 has proposed to form a tungsten film radiator contacted to the drain area of the MOS transistor in the input protection circuit, in order to increase the radiation effect for the generated joule heat at the drain area. However, this proposal is also insufficient for protecting a wiring layer as a surge current path from an excessive voltage input into the ESD protection circuit. Thus, development of a new measurement for sufficiently radiating the heat generated in the wiring layer used as a surge current path in the ESD protection circuit has been sought.

SUMMARY OF THE INVENTION

An embodiment consistent with the present invention relates to a semiconductor apparatus, comprised of an input protection circuit being connected to a wiring for connecting between an external terminal and an internal circuit, the input protection circuit including a protection element for protecting the internal circuit from an excessive electrostatic surge input supplied to the external terminal, a first metal wiring layer being coupled to the input protection circuit and included in a current path of the surge electrostatic surge input, and a radiator comprised of a sufficient thermal conductivity material being connected to the first metal wiring layer.

A further embodiment consistent with the present invention relates to a semiconductor apparatus, comprised of an input protection circuit being connected to a wiring for connecting between an external terminal and an internal circuit, the input protection circuit including a protection element for protecting the internal circuit from an excessive electrostatic surge input supplied to the external terminal, a first metal wiring layer being included in a surge current path for the input protection circuit and coupled to a diffused layer in a semiconductor substrate through a contact, and a radiator comprised of a sufficient thermal conductivity material being formed on the first metal wiring layer through an interlayer insulating film.

BRIEF DESCRIPTION OF THE DRAWINGS

The accompanying drawings, which are incorporated in and constitute part of this specification, illustrate various embodiments and/or features of the invention, and together with the description, serve to explain the invention. Wherever possible, the same reference number will be used throughout the drawings to describe the same or like parts. In the drawings.

DESCRIPTION OF THE EMBODIMENTS

Figure 1:
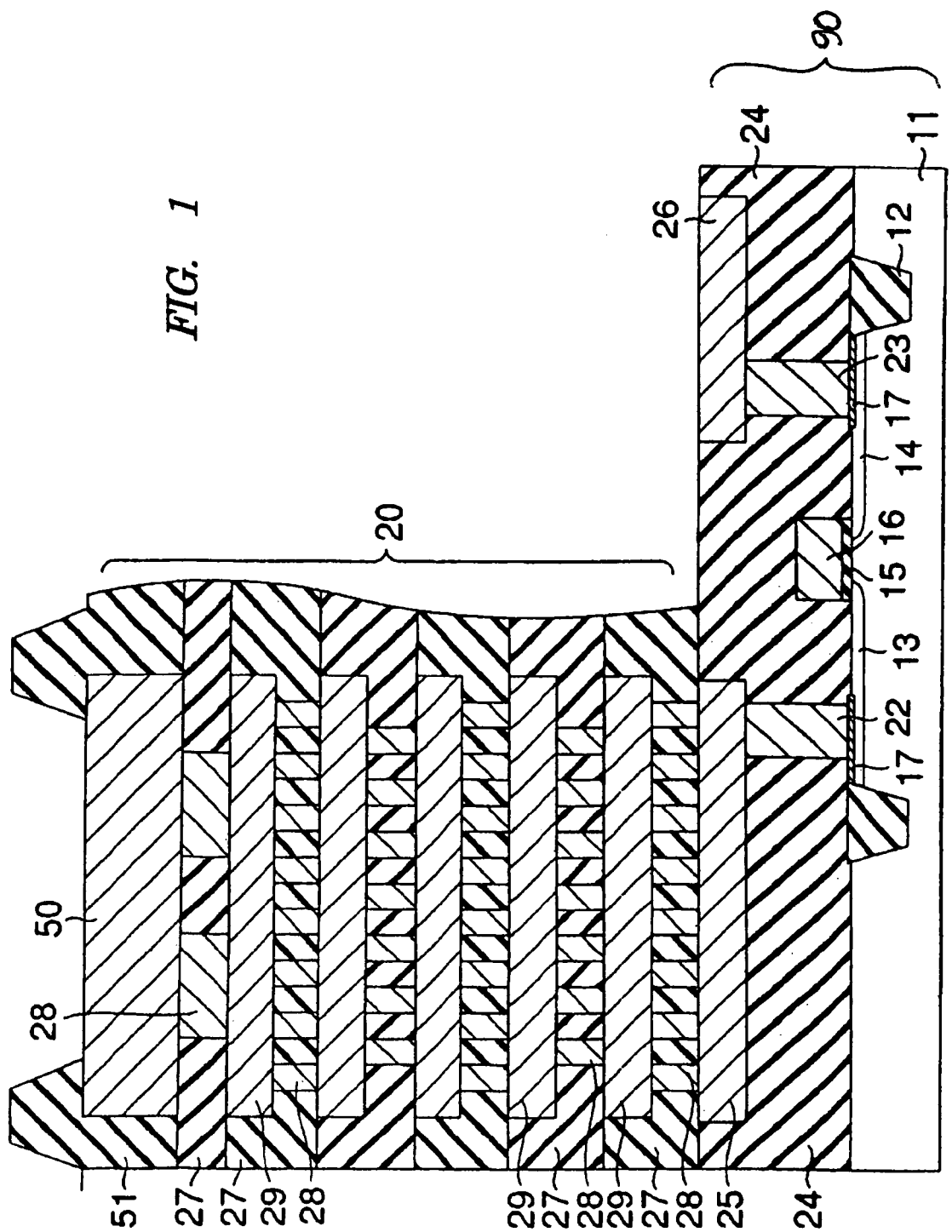
FIG. 1 is a cross sectional view illustrating an embodiment of a radiator configuration for an ESD protection circuit in a semiconductor apparatus consistent with an embodiment of the present invention.

Reference will now be made in detail to the exemplary embodiments consistent with the present invention, examples of which are illustrated in the accompanying drawings. FIG. 1 illustrates an exemplary protection element used in an ESD protection circuit, and an exemplary radiator configuration coupled to a wiring in the ESD protection circuit. According to this embodiment, a protection element that is comprised of metal layers and alloy films is coupled to a wiring layer used as a surge current path of an ESD protection circuit for a semiconductor apparatus.

In an embodiment consistent with the present invention, a NMOSFET is used as a protection element for an ESD protection circuit by directly connecting a gate and a source of a NMOSFET, so as to construct a diode. One end of a protection element is connected to an input wiring that couples an input terminal (bonding pad) to an input terminal. The other end of the protection element is coupled to a grounding node.

A NMOSFET protection element according to the present invention, as illustrated in FIG. 1, is constructed by forming drain area 13 of a n-type diffused layer and source area 14 of a n-type diffusion layer on an element area that is separated by element separation areas 12 in p-type semiconductor substrate 11. Gate electrode 16 is formed on a channel area between drain area 13 and source area 14, through gate insulating film 15. Interlayer insulating film 24 is provided on substrate 11 so as to provide contact holes (plugs). The respective contact holes are positioned on each of drain area 13 and source area 14. In each of the contact holes, respectively, plug shaped contact elements 22 and 23 are embedded. Each of contact elements 22 and 23 is coupled to drain wiring 25 and source wiring 26, respectively. Wirings 25 and 26 can be, for example, copper (Cu) or aluminum (A1), as a first metal layer wiring. On each surface portion of drain area 13 and source area 14, metal silicide layers 17 are formed so as to contact each of contact elements 22 and 23, respectively.

Drain wiring 25 and source wiring 26 are embedded in each of wiring grooves formed by a dual damascene process so as to connect to the contact holes in interlayer insulating film 24. It is, of course, also possible to form drain and source wirings 25 and 26 on interlayer insulating film 24 by the accumulation method.

According to this embodiment, a radiator is further constructed on a first metal wiring layer that is used as a surge current path for an ESD protection circuit, so as to contact the first metal wiring layer. Thus, the radiator is provided on a joule heat generating portion at which the heat is generated due to a surge current flowing in an ESD protection circuit. In the embodiment illustrated in FIG. 1, for example, such heat is generated in drain wiring 25. Radiator 20 is simultaneously formed during formation of a configuration of upper layer wirings.

As an exemplary configuration, radiator 20 includes a plurality of metal wiring layers 29 that are formed by hierarchical embedding into a plurality of interlayer insulating films 27 and top metal wiring layer 50. The plurality of interlayer insulating films 27 are contacted to a plurality of metal contacts 28 at multiple points. Top metal wiring layer 50 is exposed as an input pad, i.e., a bonding pad. The number of the plurality of metal wiring layers is determined based on the number of wiring layers used in another circuit.

In the fabrication process of radiator 20, interlayer insulating film 27 is accumulated on first layer metal wiring layer 25. Then, plurality of via-metals 28 and second metal layer wiring 29 are embedded in first interlayer insulating film 27 by the dual damascene process. By repeating this process, a plurality of metal wiring layers 29 can be formed into a hierarchical structure of a plurality of layers. After fabrication of a hierarchical structure of metal wiring layers 29, passivation film 51 is formed on top metal wiring layer 50 of the metal wiring layers. Finally, portion 52 of passivation film 51 is removed, in order to enable use of top metal wiring layer 50 as a bonding pad.

As explained above, the radiator is fabricated as a plurality of hierarchical layers by using plurality of metal wiring layers 29, top wiring layer 50, and plurality of connecting via-metal layers 28 that connects to each of metal wiring layers 29 and top wiring layer 50. A number of each of via-metal layers 28 provided between each of interlayer insulating films 27, may be the same, or different, by changing the number of the respective interlayer insulating films 27. Thus, it is also possible fabricate the radiator by forming different numbers of layers in the respective via-metals for the respective interlayers. In the example illustrated in FIG. 1, via-metals 28 formed in the interlayer immediately below top metal layer 50 are fabricated by a smaller number of via-metals 28 than the number of via-metals 28 provided for other interlayers.

In this exemplary radiator configuration, a plurality of hierarchical layers comprised of metal wiring layers 29, top wiring layer 50, and plurality of connecting via-metals 28, is coupled to drain wiring 25 that is connected to ESD protection element 90. Thus, radiator 20 is used as a current path between bonding pad 50 and ESD protection element 90. Accordingly, it becomes possible to effectively radiate the heat generated in the wirings provided between the bonding pad and the ESD protection element into the outside of the semiconductor chip through radiator 20, when a surge current flows into radiator 20 itself. Consequently, it becomes possible to protect the wiring layer used as a surge current path and it is also possible to increase tolerance of ESD protection element 90.

Figure 6:
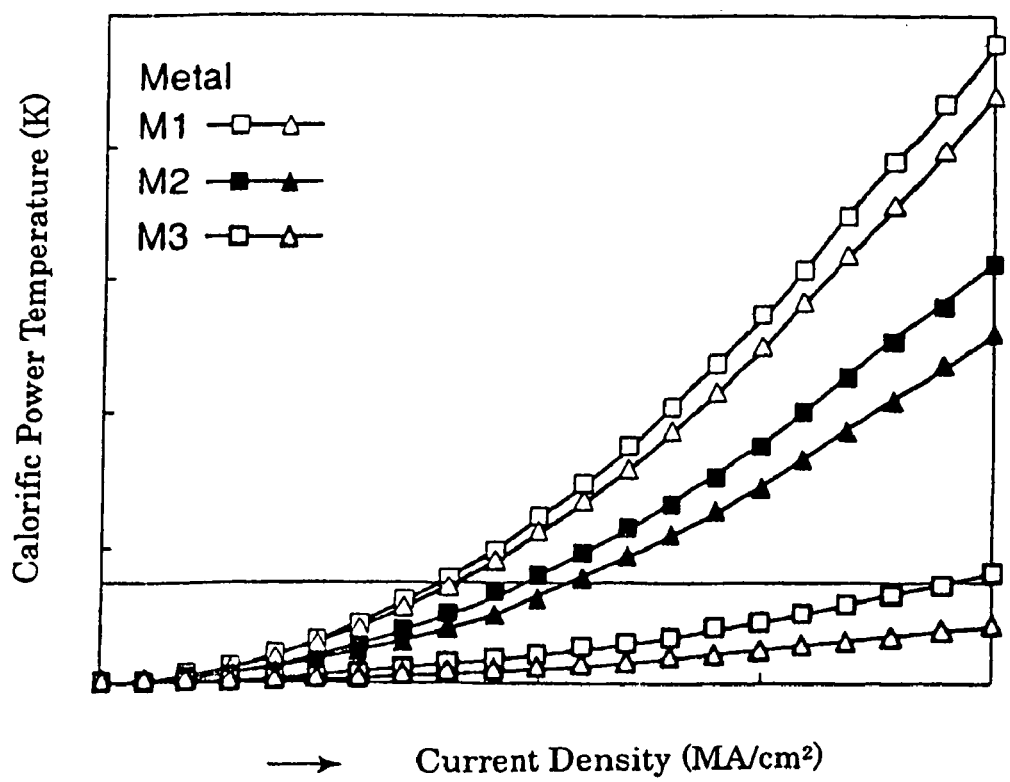
FIG. 6 is a graph showing characteristic curves representing a relationship between a current density flowing in the metal wiring layer in the ESD protection circuit having a radiator, and a temperature increase of the respective metal wiring layers M1, M2 and M3 that are illustrated in FIG. 1 by using parameters of the contact plug size.

FIG. 6 illustrates graphically a relationship between a current density that flows in an ESD protection circuit, including a radiator formed of multiple wiring layers, as illustrated in FIG. 1, and a temperature increase at three metal wiring layers M1, M2 and M3 among the multiple wiring layers. These characteristic curves are shown by using a contact plug size of the lowest metal wiring layer M1 as a parameter. The rectangle-line shows a 1% contact, and the triangle-line shows a 10% contact. From the characteristic curves, it can be understood that an ESD protection circuit including a radiator can reduce a temperature increase much more significantly at metal wiring layers M2 and M3.

Consequently, the ESD protection circuit including a radiator consistent with the embodiments of the invention does not easily allow a fuse breakdown in a metal wiring layer, even when an appreciable amount of joule heat is generated in the ESD protection element. Thus, the embodiments of the present invention can increase the tolerance of the wiring layer against the ESD surge current input. Further, since the radiator for an ESD protection element consistent with embodiments of the present invention is comprised of multiple stacked metal wiring layers and provided on an upper space of the metal wiring layer connected to the ESD protection element, it does not add to the manufacturing processes of the semiconductor apparatus. Further, the configuration consistent with embodiments of the invention can achieve this without increasing the wiring area connected to the ESD protection element.

In FIG. 1, a portion of top metal wiring layer 50 is exposed as a bonding pad. Of course, it is possible to cover all the surface area of top wiring layer 50 with an insulating film if it is not used as a bonding pad. Even when the entire radiator is embedded in an insulating layer, the radiation effect can still be achieved.

In FIG. 1, the radiator consistent with an embodiment of the invention is formed as a hierarchical structure of a plurality of metal wiring layers and a plurality of via-metals. In another exemplary embodiment, it is also possible to fabricate the radiator as a single layer configuration. In either case, it is possible to fabricate the radiator simultaneously during processes for manufacturing a normal multi-layer wiring structure. Further, it is also possible to connect the radiator to a wiring layer node used as a surge current path for an ESD protection circuit. Of course, it is also possible to provide the radiator connected to both drain wiring 25 and source wiring 26 in order to increase the radiation effect.

Usually, it is desirable to arrange the radiator directly above the wiring layer to be used as a surge current path for an ESD protection element for reducing the generated joule heat. It is, of course, possible to modify the configuration and the shape of the radiator, or the number or the shape of the via-metals, if the location of the radiator is restricted by the position of other wirings.

In an embodiment consistent with the present invention, it is desirable for the metal wiring layers of the radiator to be formed by a metal or alloy film having a high radiation effect, such as, for example, a Cu/TaN, AlCu/TiMN, or a tungsten (W) film. If the current does not flow in the radiator itself, it is possible to use another material of a high heat radiation effect, other than a metal.

Figure 2:
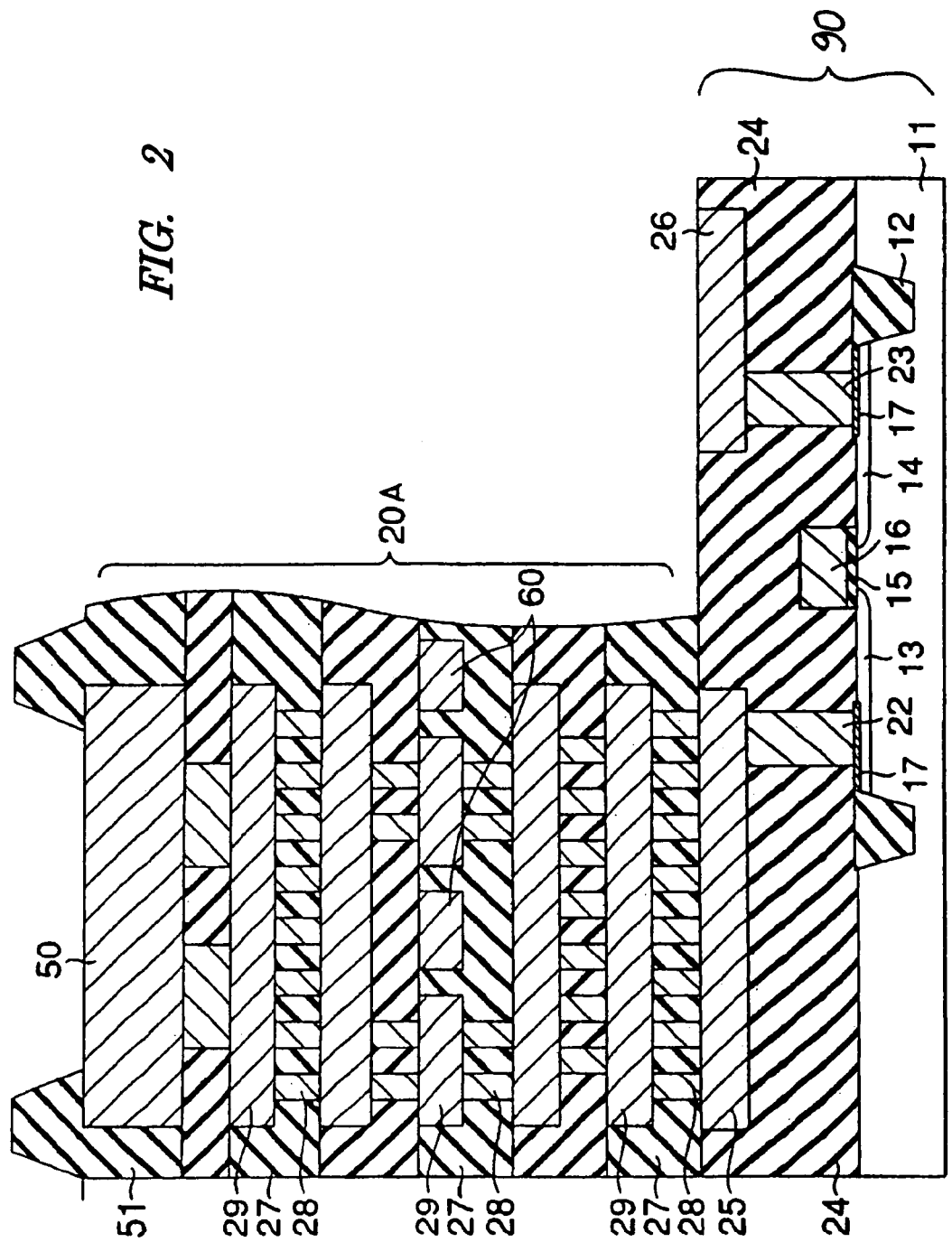
FIG. 2 is a cross sectional view illustrating another embodiment of the radiator configuration for the ESD protection circuit in the semiconductor apparatus consistent with an embodiment of the present invention.

FIG. 2 illustrates another embodiment consistent with the present invention, showing radiator 20A. In this configuration, a portion of an interlayer of a plurality of hierarchical layers for the configuration of radiator 20A lacks a via-metal in order to avoid a restricted position 60 for a position of another wiring for another circuit. Thus, the number of via-metals 28 at restricted position 60 being restricted by another circuit is different from those present on another interlayer. With the exception of this reduced number of via-metals, other structures of radiator 20A are substantially the same as the embodiment as illustrated in FIG. 1, as indicated by the same or similar reference numbers. With this configuration, it becomes possible to simultaneously provide both wiring layers and radiator 20A.

Figure 3:
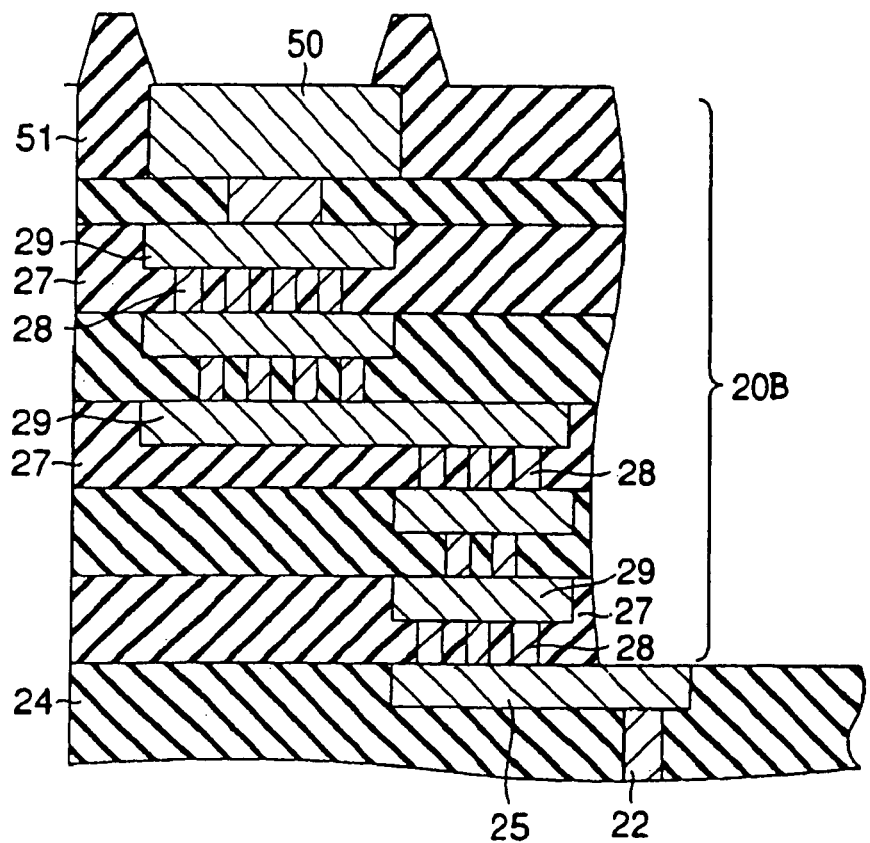
FIG. 3 is a cross sectional view illustrating another embodiment of the radiator configuration for the ESD protection circuit in the semiconductor apparatus consistent with an embodiment of the present invention.

FIG. 3 illustrates another embodiment of a plurality of hierarchical layers, as shown by radiator 20B for an ESD protection circuit in a semiconductor apparatus consistent with the present invention. When compared to the configuration of radiator 20 shown in FIG. 1, some portions of the plurality of hierarchical layers in the embodiment of radiator 20B are shifted from the upper position on drain wiring 25, for example, such portions that are restricted by positions of other wiring layers for forming the ESD protection circuit. By forming this shifted configuration, it becomes possible to provide both the wiring layers forming the ESD protection circuit and radiator 20B without difficulty.

Figure 4:
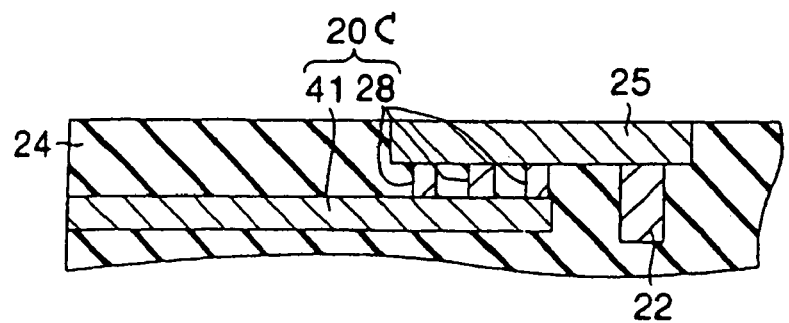
FIG. 4 is a cross sectional view illustrating another embodiment of the radiator configuration for the ESD protection circuit in the semiconductor apparatus consistent with an embodiment of the present invention.

FIG. 4 illustrates yet another embodiment of the radiator configuration for an ESD protection circuit in a semiconductor apparatus consistent with the present invention. Radiator 20C, shown in FIG. 4, is fabricated by polysilicon wiring layer 41 formed below the level of drain wiring 25 of the protection element and below plurality of via-metals 28 that are embedded in interlayer insulating film 24. Via-metals 28 are provided between polysilicon wiring layer 41 and drain wiring 25 in order to couple polysilicon wiring layer 41 to drain wiring 25. While different from such a plurality of hierarchical layers as illustrated in FIG. 1, radiator 20C has a simpler configuration. Consequently, it can be easily manufactured. Further, it is easily fabricated even when the position of radiator 20C is restricted by the positions of other wiring layers for fabrication of an ESD protection circuit. This configuration of radiator 20C can also be provided with radiator 20, as shown in FIG. 1, in order to increase the radiation effect.

Figure 5:
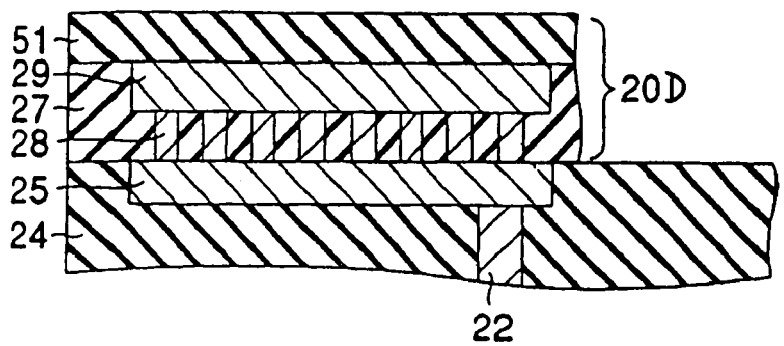
FIG. 5 is a cross sectional view illustrating another embodiment of the radiator configuration for the ESD protection circuit in the semiconductor apparatus consistent with an embodiment of the present invention.

FIG. 5 is a cross sectional view of yet another embodiment of a radiator for application to an ESD protection circuit in a semiconductor apparatus consistent with the present invention. Radiator 20D, illustrated in FIG. 5, is fabricated by metal wiring layer 29 that is embedded in a wiring groove formed in an interlayer insulating film 27 on drain wiring 25 of the ESD protection element, and by a plurality of via-metals 28 that are embedded in interlayer insulating film 27 in order to couple drain wiring 25 to metal wiring layer 29. Furthermore, the entire surface of metal wiring layer 29 is covered by insulating film 51. Radiator 20D is also applicable to a single layer configuration as illustrated and explained in FIG. 4. Accordingly, it is easily manufactured. When it is desired that a portion of metal wiring layer 29 is used as bonding pad, a portion of insulating film 51 covering metal wiring layer 29 can be opened.

In order to increase the thermal conductivity and the heat radiating effect, it is possible to make a contact area of a metal wiring layer for interlayers wider than that in the radiator configuration shown in FIG. 1. Thus, some of interlayers and via-metals 28 in a plurality of hierarchical layers can be made by a single via-metal of a larger size than the total sizes of the plurality of via-metals 28 for the other interlayers. Such a larger sized single via-metal can be applied to radiator 20D of the single layer configuration shown in FIG. 5. Such a single layer configuration can be beneficial for easily manufacturing a radiator having a higher heat radiating effect.

Figure 7:
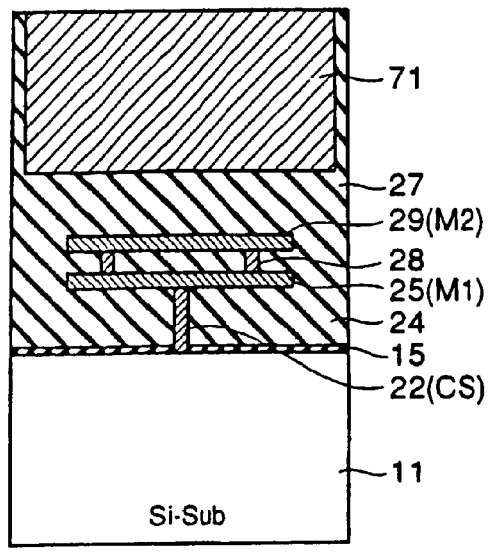
FIG. 7 is a cross sectional view illustrating another embodiment of the radiator configuration for the ESD protection circuit in the semiconductor apparatus consistent with an embodiment of the present invention.

FIG. 7 illustrates yet another embodiment of a radiator consistent with the present invention. When compared to the radiator shown in FIG. 5, the radiator illustrated in FIG. 7 includes a pad area, such as bonding pad 71, comprised of aluminum (A1), on the interlayer insulating film 27 over upper wiring layer 29 (M2). Lower wiring layer M1 is drain wiring 25; and this and contact 22 (CS) are the same as illustrated in FIG. 5. The A1 wiring of bonding pad 71 is covered by a surface protection film (not shown), and a portion of the protection film is opened in order to expose a portion of the A1 wiring. In this embodiment, current flow in the circuit is divided between the two wiring layers 29 (M1) and 25 (M2).

Figure 8:
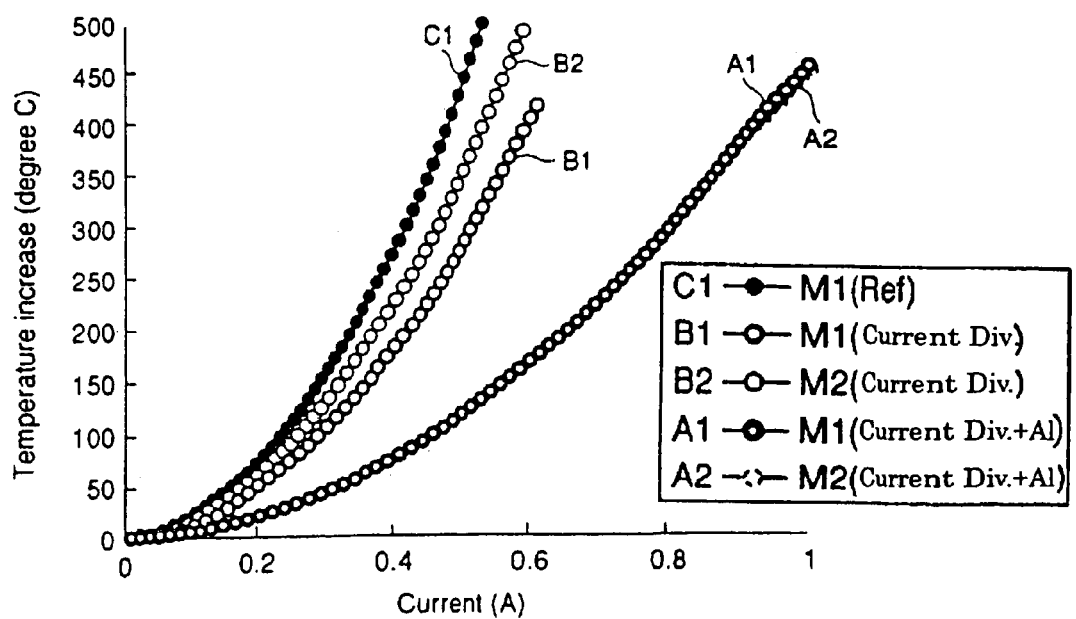
FIG. 8 is a graph showing relationships between a divided current flowing in the two wiring layers M1 and M2, and temperature increase of the respective wiring layers M1 and M2.

FIG. 8 graphically shows relationships between the divided current and temperature increases of the respective wiring layers M1 and M2, when the contact size (CS) is fixed at 0.1%. In FIG. 8, A1 and A2 illustrate the corresponding characteristic curves of the respective wiring layers M1 and M2. To compare the characteristic curves A1 and A2, two characteristic curves B1 and B2 correspond to a case when only the upper wiring layer M2 (metal wiring layer 29) is added, i.e., bonding pad 71 is not provided. In addition, a characteristic curve C1 is shown in FIG. 8, corresponding to a case when only drain wiring 25 is provided, i.e., upper wiring layer M2 is not provided. As apparent from these characteristic curves, it is understood that characteristic curves B1 and B2 demonstrate an improved heat radiating effect over characteristic curve C1 due to the presence of upper wiring layer M2 (metal wiring layer 29). Furthermore, characteristic curves A1 and A2 demonstrate an improved heat radiating effect over the characteristic curves B1 and B2 due to the presence of bonding pad 71.

Figure 9:
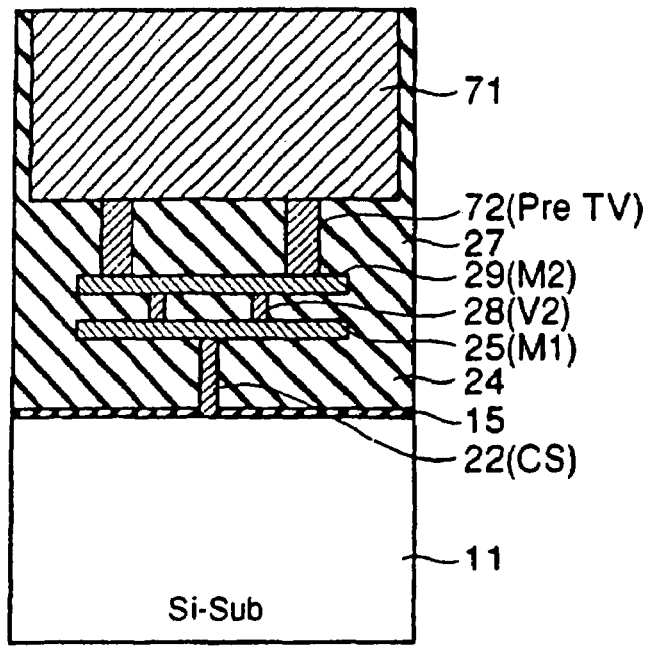
FIG. 9 is a cross sectional view illustrating another embodiment of the radiator configuration for the ESD protection circuit in the semiconductor apparatus consistent with an embodiment of the present invention.

FIG. 9 illustrates another embodiment, similar to that shown in FIG. 7. In this embodiment, a plurality of via-metals 72 (Pre TV) are formed by embedding into interlayer insulating film 27, in order to connect bonding pad 71 and metal wiring layer 29 (M2). The remaining portions of the configuration are substantially the same as the embodiment shown in FIG. 7.

Figure 10:
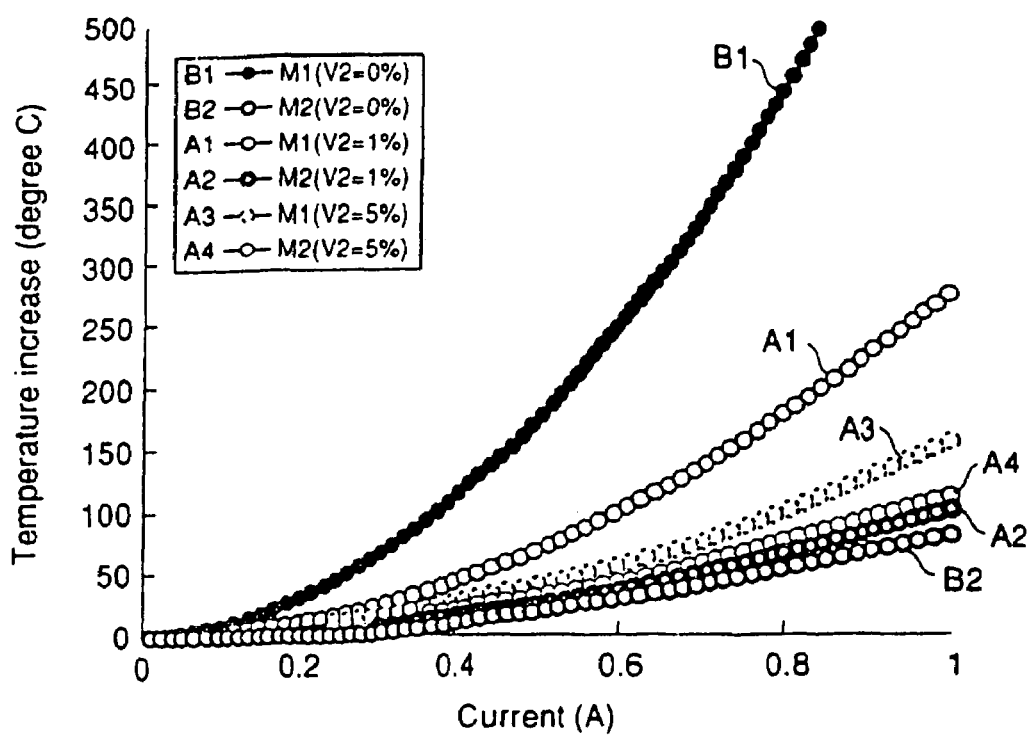
FIG. 10 is a graph illustrating characteristic curves of a current flowing in the lower wiring layer M1, and a respective temperature increase of the two wiring layers M1 and M2 illustrated in FIG. 9.

FIG. 10 graphically shows relationships between the divided currents flowing into the two wiring layers M1, M2, and the temperature increases of the respective wiring layers M1, M2, by fixing a Pre TV area ratio against a surface area of metal wiring layer 29 to 10% and a size of CS to 0.1%. Furthermore, area ratios of via-metal 28 (V2) against the surface area of drain wiring 25 are used as parameters of 1% and 5%, respectively. In FIG. 10, A1 and A2 show the characteristic curves corresponding to respective wiring layers M1 and M2 when the area ratio of via-metal 28 (V2) is at 1%. Likewise, characteristic curves A3 and A4 correspond to respective wiring layers M1 and M2 when the area ratio of the via-metal 28 (V2) is at 5%. To compare the characteristic curves A1, A2, A3, and A4, FIG. 10 shows characteristic curves B1 and B2, corresponding to an embodiment when via-metal 28 (V2) is not formed by embedding, thus, the area ratio of via-metal 28 (V2) is at 0%.

From these characteristic curves shown in FIG. 10, it can be understood that the temperature increase is reduced as the area ratio of via-metal 28 (V2) increases, since upper wiring layer M2 (metal wiring layer 29) has a higher heat radiating effect than lower wiring layer M1 (drain wiring 25). Thus, the temperature increases of respective wiring layers M1 and M2 can be reduced, because the heat generated in upper wiring layer M2 (metal wiring layer 29) is absorbed from the semiconductor substrate through lower wiring layer M1 (drain wiring 25) and contact 22 (CS).

Figure 11:
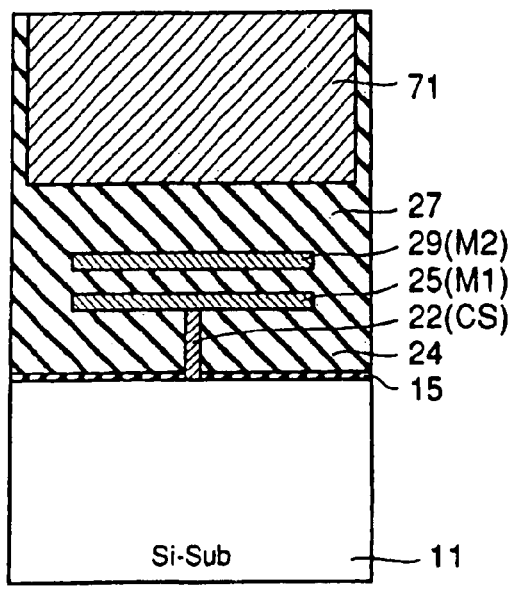
FIG. 11 is a cross sectional view illustrating another embodiment of the radiator configuration for the ESD protection circuit in the semiconductor apparatus consistent with an embodiment of the present invention.

FIG. 11 shows yet another embodiment of a radiator consistent with the present invention. A different feature, compared to radiator 20D illustrated in FIG. 5, is that via-metals 28 for connecting upper metal wiring layer 29 (M2) to drain wiring 25 are omitted, so that upper wiring layer 29 (M2) becomes a dummy wiring layer. Another different feature is that bonding pad 71 is provided on interlayer insulating film 27 over metal wiring layer 29, without via-metals 28 therebetween. Bonding pad 71, for example, can be comprised of A1. Thus, FIG. 11 shows a modification of the radiator configuration illustrated in FIG. 9.

Figure 12:
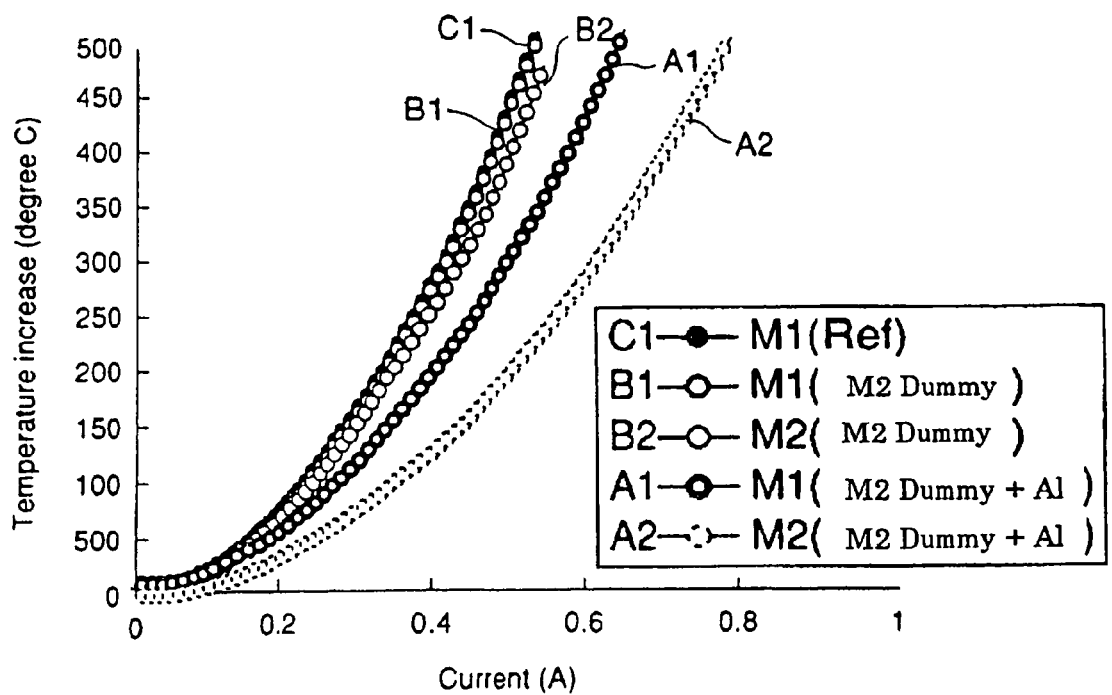
FIG. 12 is a graph illustrating characteristic curves of a current flowing in the lower wiring layer M1, and a respective temperature increase of the two wiring layers M1 and M2 illustrated in FIG. 11.

In FIG. 12, A1 and A2 represent characteristic curves showing a relationship between the currents flowing in lower wiring layer M1 (drain wiring 25) and the temperature increases of the two wiring layers M1 and M2, when a size of CS is fixed at 0.1%. To compare with the characteristic curves A1 and A2, B1 and B2 show characteristic curves corresponding to respective wiring layers M1 and M2, when only upper metal wiring layer 29 (M2) is added and bonding pad 71 is not provided. In addition, characteristic curve C1 corresponds to an embodiment in which only drain wiring 25 is provided, and upper wiring layer 29 (M2) is not provided.

From these characteristic curves, it becomes apparent that the temperature increase of upper metal wiring layer 29 (M2), as a dummy wiring layer, is lower than that of lower metal wiring layer M1 (drain wiring 25). It is also apparent that characteristic curves B1 and B2 show improvements over characteristic curve C1, due to a heat radiating effect by upper wiring layer 29 (M2). Furthermore, characteristic curves A1 and A2 show improvements over characteristic curves B1 and B2, due to a heat radiating effect by bonding pad 71.

Figure 13:
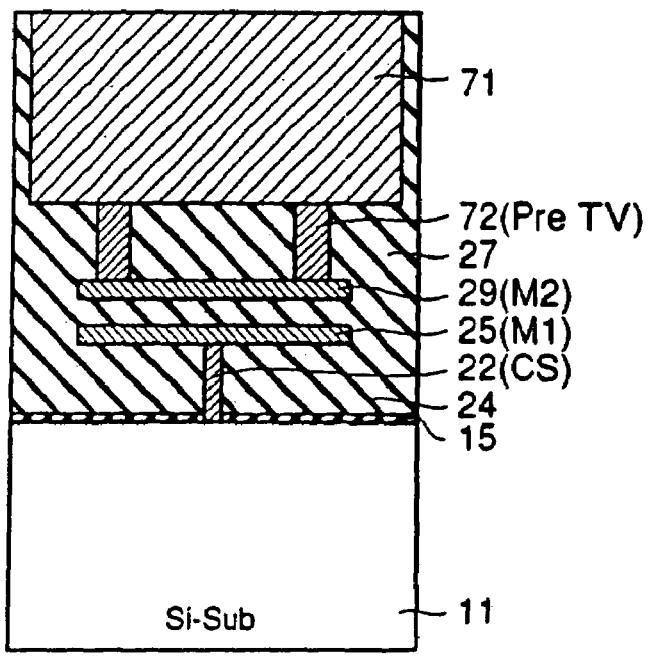
FIG. 13 is a cross sectional view illustrating another embodiment of the radiator configuration for the ESD protection circuit in the semiconductor apparatus consistent with an embodiment of the present invention.

FIG. 13 illustrates further modifications of the radiator configuration embodiment illustrated in FIG. 11. In this embodiment, a plurality of via-metals 72 (Pre TV) for connecting bonding pad 71 and metal wiring layer 29 is embedded in interlayer insulating film 27.

Figure 14:
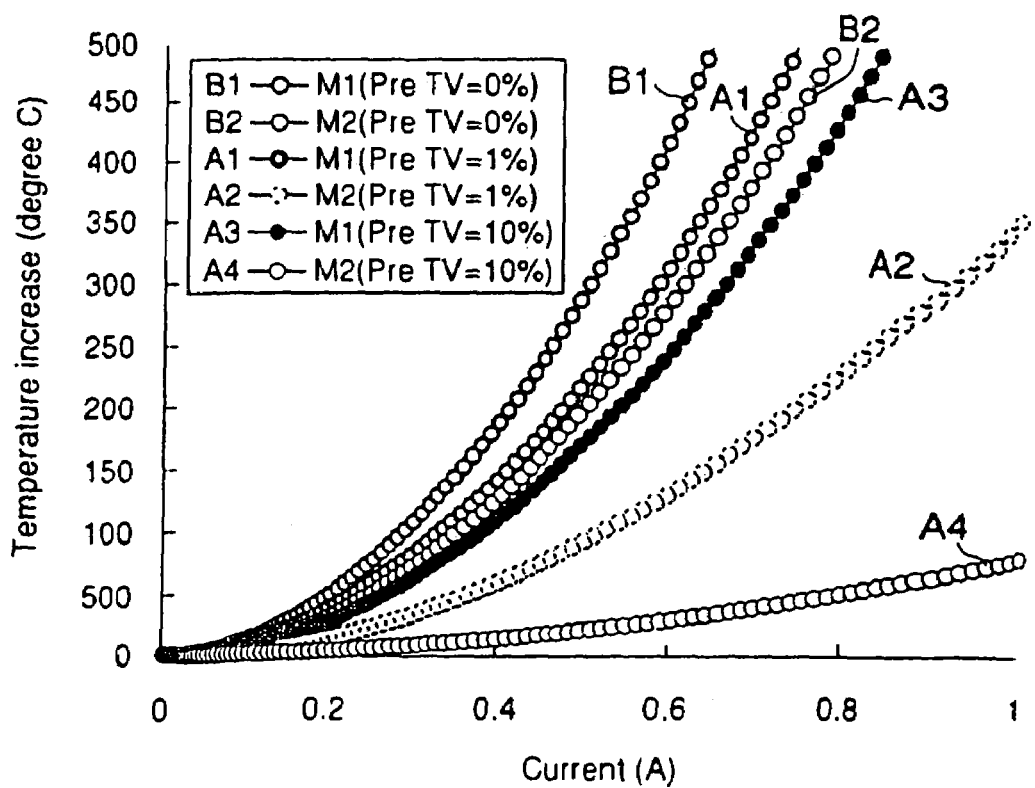
FIG. 14 is a graph illustrating characteristic curves of a current flowing in the lower wiring layer M1, and a respective temperature increase of the two wiring layers M1 and M2 illustrated in FIG. 12.
Figure 15:
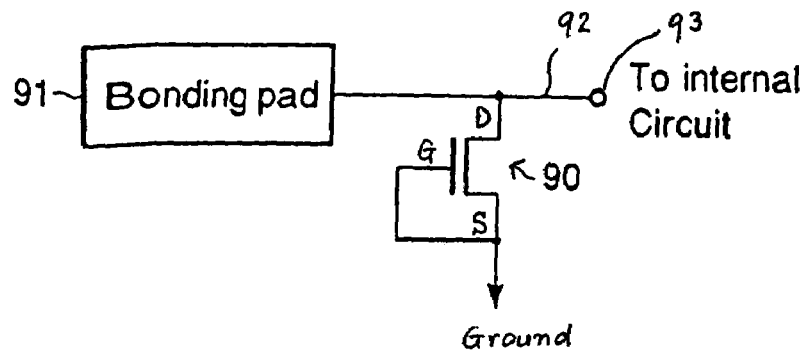
FIG. 15 illustrates an equivalent circuit in a conventional ESD protection circuit for application in a semiconductor apparatus.
Figure 16:
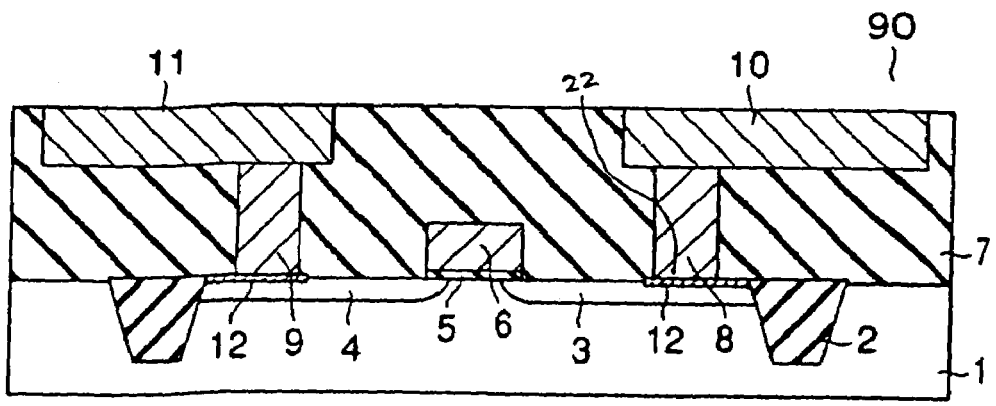
FIG. 16 illustrates a configuration of a protection element used in a conventional ESD protection circuit, such as that shown in FIG. 15.
Figure 17:
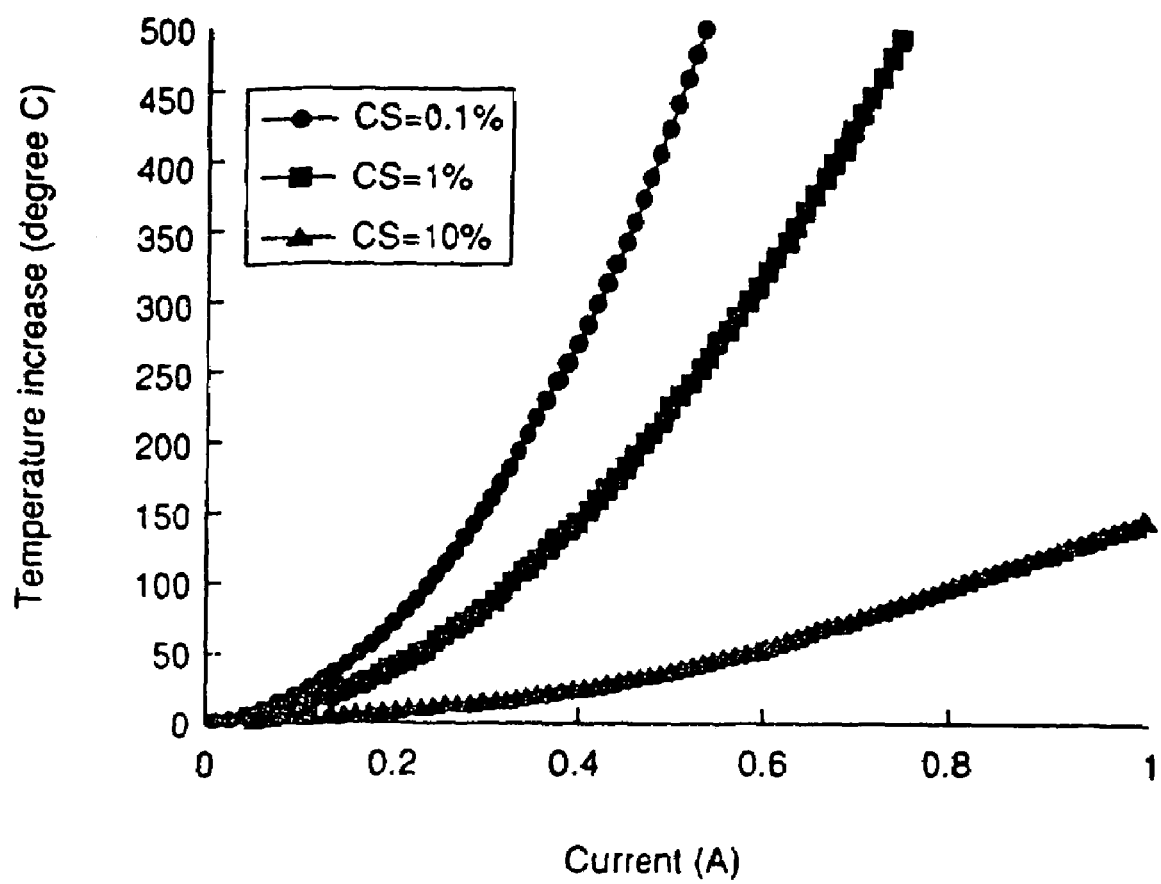
FIG. 17 is a graph illustrating characteristic curves showing a relationship between a current and a temperature increase of a metal wiring layer of the protection element, when a size of the contact plug shown in FIG. 16 is changed as a parameter.

FIG. 14 illustrates relationships between current flowing in lower drain wiring layer 25 (M1) and temperature increases of respective wiring layers M1 and M2. In this embodiment, the size of CS is fixed at 0.1%, and the relationships between current and temperature increases, due to the generated heat, are represented by using an area ratio of via-metals 72 (Pre TV) to the surface area of upper metal wiring layer 29 (M2) with values of 1% and 10%. Characteristic curves A1 and A2 correspond to each of wiring layers M1 and M2 when the via-metals 72 (Pre TV) ratio is 1%. Characteristic curves A3 and A4 correspond to wiring layers M1 and M2 when the via-metals 72 (Pre TV) ratio is 10%. Characteristic curves B1 and B2 correspond to each of wiring layers M1 and M2 when via-metals 72 (Pre TV) are not embedded, i.e., the ratio is 0%.

From these characteristic curves, it can be understood that the temperature increase of upper dummy wiring layer M2 is lower than that of lower drain wiring layer 25 (M1). Furthermore, it can be understood that the temperature increase of respective wiring layers M1 and M2, due to the generated heat, can be reduced by heat radiation through via-metals 72 (Pre TV) and bonding pad 71. Thus, as via-metals 72 (Pre TV) increase in size, it becomes possible to radiate much more heat generated in a semiconductor apparatus.

As explained above, a semiconductor apparatus consistent with an embodiment of the invention can protect wiring layers for an ESD protection circuit from a surge current, since the wiring layers that are used as surge current paths can efficiently radiate the heat generated in the wiring layers.

This invention is not limited to the embodiments as explained above, but can be performed using various configurations. It will be apparent to those skilled in the art that various modifications and variations can be made in the context of the present invention, and in its practice, without departing from the scope and spirit of the invention.

What is claimed is:

1. A semiconductor apparatus, comprising:
    an input protection circuit coupled to a wiring provided between an external terminal and an internal circuit, the input protection circuit including a protection element for protecting the internal circuit from an excessive electrostatic surge input applied to the external terminal;
    a first metal wiring layer coupled to the input protection circuit, the first metal wiring layer included in a current path for the electrostatic surge input;
    a radiator coupled to the first metal wiring layer, the radiator being comprised of a sufficient thermal conductivity material, the radiator being provided with a second metal wiring layer and plural sets of via-metals, wherein
        the second metal wiring layer is formed on the first metal wiring layer so as to have a structure of a plurality of hierarchical layers through respective interlayer insulating films, and
        plural sets of via-metals have a structure of a plurality of hierarchical layers, each of the plural sets of via-metals being formed in each of the plurality of interlayer insulating films, so as to connect an upper metal wiring layer to a lower metal wiring layer; and
    a separate wiring layer;
    wherein the plural sets of via-metals are respectively connected to the second metal wiring layer, and the number of the via-metals of one of the plural sets of via-metals formed in one of the interlayer insulating layers is reduced from the number of the via-metals of another one of the plural sets of via-metals formed in another one of the interlayer insulating layers, and
    wherein the separate wiring layer is provided in one of the interlayer insulating layers so as to avoid contacting the second metal wiring layer and the via-metals.

2. The semiconductor apparatus of claim 1, wherein a surface of a top metal wiring layer of the radiator is covered by a surface protection film, and a portion of the surface protection film corresponding to a position of an input pad area of the top metal wiring layer is removed.

3. The semiconductor apparatus of claim 1, wherein the first metal wiring layer is coupled to a diffused layer of a semiconductor substrate by a contact.

4. A semiconductor apparatus, comprising:
    an input protection circuit coupled to a wiring provided between an external terminal and an internal circuit, the input protection circuit including a protection element for protecting the internal circuit from an excessive electrostatic surge input supplied to the external terminal;
    a first metal wiring layer coupled to the input protection circuit, the first metal wiring layer included in a current path for the electrostatic surge input;

a radiator coupled to the first metal wiring layer, the radiator being comprised of a sufficient thermal conductivity material, the radiator being provided with a second metal wiring layer and plural sets of via-metals, wherein the second metal wiring layer is formed on the first metal wiring layer so as to have a structure of a plurality of hierarchical layers through respective interlayer insulating films, and the plural sets of via-metals have a structure of a plurality of hierarchical layers, each of the plural sets of via-metals being formed in each of the plurality of interlayer insulating films, so as to connect an upper metal wiring layer to a lower metal wiring layer; and other wiring layers;

wherein the plural sets of via-metals are respectively connected to the second metal wiring layer, and the number of the via-metals of one of the plural sets of via-metals formed in one of the interlayer insulating avers is reduced from the number of the via-metals of another one of the plural sets of via-metals formed in another one of the interlayer insulating layers; and wherein portions of the plurality of the hierarchical layers of the second metal wiring layer and the via-metals formed in the interlayer insulating layers are provided at shifted positions from an upper portion of the first metal wiring layer so as to avoid the positions for the other wiring layers.

5. The semiconductor apparatus of claim 4, wherein a surface of a top metal wiring layer of the radiator is covered by a surface protection film, and a portion of the surface protection film corresponding to a position of an input pad area of the top metal wiring layer is removed.

6. The semiconductor apparatus of claim 4, wherein the first metal wiring layer is coupled to a diffused layer of a semiconductor substrate by a contact.

* * * * *